United States Patent
Kodoi et al.

(10) Patent No.: US 8,877,431 B2
(45) Date of Patent: Nov. 4, 2014

(54) PROCESS FOR PRODUCING LIQUID EJECTION HEAD

(71) Applicant: Canon Kabushiki Kaisha, Tokyo (JP)

(72) Inventors: Takuma Kodoi, Kawasaki (JP); Chiaki Muraoka, Kawaguchi (JP); Keiji Tomizawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/146,197

(22) Filed: Jan. 2, 2014

(65) Prior Publication Data

US 2014/0199633 A1    Jul. 17, 2014

(30) Foreign Application Priority Data

Jan. 11, 2013    (JP) .................................. 2013-003559

(51) Int. Cl.
*G03F 7/20*    (2006.01)
*B41J 2/16*    (2006.01)

(52) U.S. Cl.
USPC .......................................... 430/320; 430/394

(58) Field of Classification Search
None
See application file for complete search history.

(56) References Cited

U.S. PATENT DOCUMENTS

| 7,063,933 | B2 | 6/2006 | Shiba et al. |
| 7,070,912 | B2 | 7/2006 | Park et al. |
| 2008/0150997 | A1* | 6/2008 | Pulver et al. ................... 347/20 |

FOREIGN PATENT DOCUMENTS

| JP | 2001-010069 A | * | 1/2001 |
| JP | 2003-145769 A | | 5/2003 |
| JP | 2005-008652 A | | 1/2005 |
| JP | 2005-205916 A | | 8/2005 |

OTHER PUBLICATIONS

Computer-generated translation of JP 2001-010069 (Jan. 2001).*

* cited by examiner

*Primary Examiner* — John A. McPherson
(74) *Attorney, Agent, or Firm* — Fitzpatrick, Cella, Harper & Scinto

(57) ABSTRACT

A process for producing a liquid ejection head by providing, in one chip, a liquid ejection head having a portion for ejection in which an ejection orifice array is arranged and a side portion having no ejection orifice array, these portions being provided with a member of a photosensitive material, arranging the chip on a common substrate in such a chip array that these two portions are alternately arranged, and separating each chip from the substrate, the process including the steps of relatively moving a reticle of an aligner along the chip array for a photosensitive material on the substrate to expose each chip, and developing the material to obtain the member. A first reticle for forming the portion for ejection and a second reticle for forming only the side portion are used. The exposure includes a first and a second exposure treatment respectively by the first and second reticles.

20 Claims, 7 Drawing Sheets

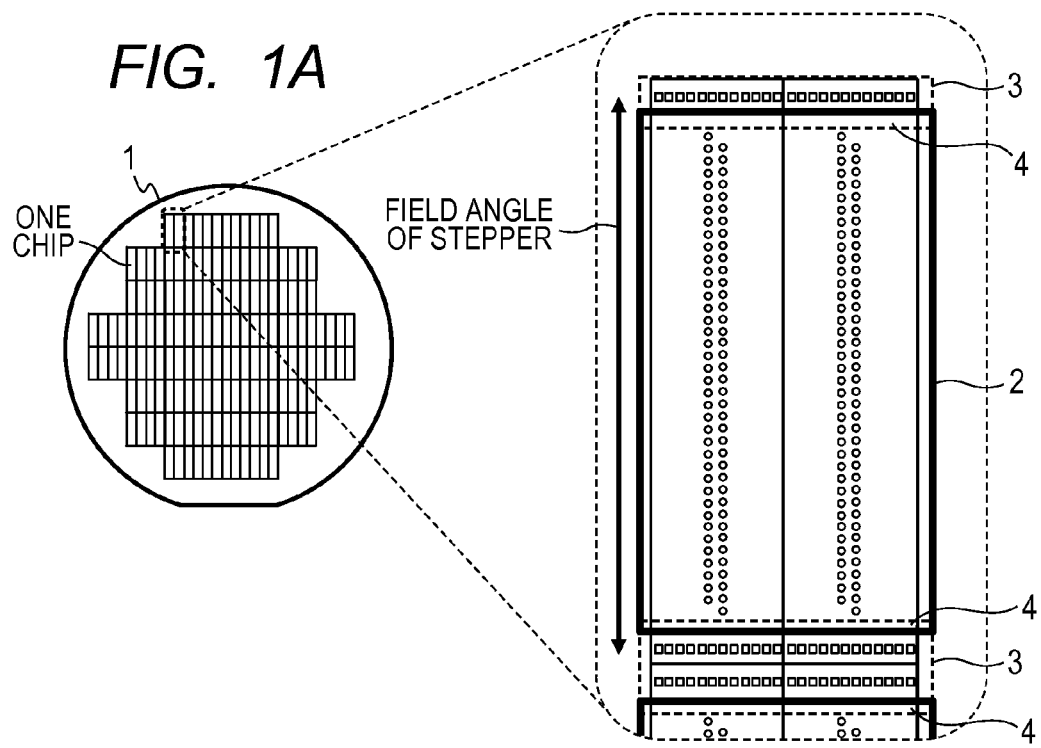
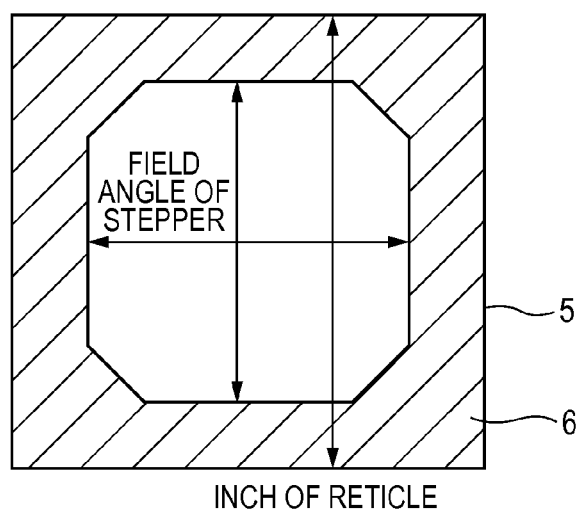

EJECTION DIRECTION

IMPACTED DOT OVERLAPPING PORTION

PROCESS FOR PRODUCING LIQUID EJECTION HEAD

BACKGROUND OF THE INVENTION

1. Field of the Invention

The present invention relates to a process for producing a liquid ejection head from which a liquid is ejected. This liquid ejection head includes such an ink jet recording head that an ink is ejected on a recording medium to conduct recording.

2. Description of the Related Art

In an apparatus provided with a liquid ejection head, it has heretofore been conducted to make long the length of an ejection orifice array of the liquid ejection head or to form ejection orifices at a high density for forming a high-quality image at a high speed. The length of the ejection orifice array is made long, whereby an image is completed on one sheet of paper by a few scans, so that the image can be formed at a high speed. The ejection orifices are arranged at a high density, whereby a higher-quality image can be formed.

There are various methods as a method for producing an ejection orifice forming member having an ejection orifice array and a flow path in such a liquid ejection head. In general, the following methods are mentioned.

(A) A method of working an inorganic metal.
(B) A method of directly forming an ejection orifice forming member on a substrate composed of an inorganic material such as Si by a processing process using photolithography.

Description of the method (A) of working the inorganic metal is omitted in the present specification. The photolithography used in the method (B) is a technique in which a circuit of an electronic part or a nozzle is patterned on a photosensitive material using a photomask, and the resultant pattern is transferred.

The photomask is also called a glass dry plate, which is a transparent plate obtained by forming an original pattern to be used in a production process of an electronic part on glass or quartz. In short, the photomask is an original plate upon transferring a pattern on an object of transfer by a transfer technology of the photolithography. In an exposure step, an image of the photomask is transferred on a photosensitive material called a photoresist for every piece. An exposed portion of the photoresist is removed or left making good use of such a property of the photoresist that solubility in a developer is changed by exposure, whereby the thus-treated photoresist becomes a mask for a subsequent dissolving and removing treatment with respect to an object for processing, the treatment being called an etching step. After removal of an unnecessary portion of the object for processing in the etching step is completed, the photoresist is removed with a liquid chemical, whereby a series of steps is completed. Another photoresist is then applied for processing of a next layer, and the same treatments are repeated.

As the photoresist at this time, may be used a liquid photoresist or a film obtained by sandwiching a resist layer of a photo-curable resin between films of polyethylene and polyester, the film being a dry film that is available from Du Pont Co.

In the liquid ejection head, it is applied to a film for improving adhesion between the Si substrate and the ejection orifice forming member as well as to the formation of the ejection orifice forming member, to say nothing of the process of forming a circuit on the Si substrate. In addition, in a microworld of several microns, such as an ejection orifice (also referred to as a nozzle), reduction exposure with a photomask formed with 4 to 5 times magnification in terms of straight line size is utilized without using a same-sized (1:1) photomask with high definition. This large photomask is called a reticle. In recent years, a 6-inch square reticle has been often used for an i-line stepper, which is an aligner of a 1:5 reduction system, in a production of an ejection orifice forming member having an ejection orifice by photolithography. The size of a usable reticle varies according to the performance of an aligner without being limited to the 6-inch square reticle alone and is, for example, 8-inch and 12-inch squares. In the case of 6-inch square, a range in which a pattern is arranged, is 110 mm, and an actual size of a pattern formed varies according to a reduction rate of an optical system. In the case of the 1:5 reduction system, an actual size of a product is up to mm at the longest for one exposure. The above description is regarding an example, and that of another reduction rate is also often used for the i-line stepper.

On the other hand, in recent years, paper pressing technology and high-definition circuit designing have been advanced in printing technology using a liquid ejection head, and so high printing accuracy has been achieved even in a long liquid ejection head having a long ejection orifice array, and the long liquid ejection head has been able to be handled effectively.

On the other hand, when a great number of liquid ejection heads are produced with good accuracy and high efficiency, a process in which a Si substrate is used as a common substrate, a great number of liquid ejection heads are fabricated as chips on the common substrate, and each chip is separated to obtain an individual chipped liquid ejection head is used. According to this process, a common treatment step for the respective chips can be conducted for a great number of chips on the common substrate with good efficiency and at a time or by a repeated operation under the same treatment conditions, and so liquid ejection heads can be produced with high accuracy and good efficiency. Even in this production process of liquid ejection heads using the common substrate, making the length of each chip long has been more and more accelerated from the above-described reason.

Under the foregoing circumstances, a long length chip becomes conspicuous, and so the whole of one chip or all of plural chips cannot fall within a reticle field angle of an aligner in the production of a liquid ejection head using the conventional 6-inch square reticle, so that difficulty is encountered upon fabricating one chip by one exposure.

In some of the prior art techniques, in the case where a long length liquid ejection head is fabricated as in the way described in Japanese Patent Application Laid-Open No. 2003-145769, exposure has been divided in the middle of an ejection orifice array to cope with the above-described problem. In addition, even when exposure is conducted by a stepper having a wide reticle field angle, the same problem is caused again when a chip size is made longer in a next-generation product.

In recent years, an ink jet recording apparatus has been required to conduct recording at a high speed and form a high-quality image, and so ejection orifices of the ink jet recording apparatus have been arranged at a high density, and the length of an ejection orifice array has been made long. Incidentally, a method for producing an ejection orifice forming member includes the above-described methods (A) and (B). Above all, in the method utilizing photolithography with a photosensitive material, the quality of an ejection orifice greatly depends on such a performance as the width of a reticle field angle of an aligner and the accuracy of a lens arranged in an optical path to the reticle. Here, the field angle means a maximum lengthwise and breadthwise width exposable by the aligner. The accuracy of a lens means accuracy in a production stage, such as its curved surface which is nearly horizontal and has a small spherical aberration, the lens being stainless, and so on. Aberration can be corrected by an optical system of the apparatus.

In addition, the size of a chip in which a liquid ejection head is fabricated is also varied, and so even upon the fabrication of one chip, the chip cannot fall within a field angle in an ejection orifice array direction or a direction perpendicular to the ejection orifice array direction by one exposure according to an aligner used, because the length of the chip is made long. It is thus necessary to dividedly conduct the exposure twice or more in some cases. The exposure dividedly conducted twice or more means that the exposure is divided into two or more exposures, because the whole chip cannot be exposed by one exposure when one member is intended to be formed on an Si substrate. In this case, a part that needs to be double exposed is caused due to the alignment accuracy of an aligner. No particular problem is caused so far as an ejection orifice arrangement density is low. However, when the ejection orifice arrangement density is high and a place dividedly exposed twice or more is present near an ejection orifice, there has been a problem that the intended form may not be obtained in some cases due to the telecentric influence of the aligner or partial overexposure. Here, the long length chip means such a chip that a region in which an ejection orifice is arranged can be exposure at one time though the whole chip cannot be exposed at one time, not such a chip that it is too long to a reticle field angle like the prior art literature described above.

SUMMARY OF THE INVENTION

It is an object of the present invention to solve the above problem. That is to say, the object is to provide a process for producing a liquid ejection head, by which ejection accuracy of a liquid from an ejection orifice is not affected even when producing such a long length chip that the whole of one chip or all of plural chips cannot be exposed at one time, though only an ejection orifice array falls within a field angle by multi-exposure. In an aspect of the present invention, there is provided a process for producing a liquid ejection head by providing, in one chip, a liquid ejection head having a portion for ejection in which an ejection orifice array is arranged and a side portion having no ejection orifice array, these portions being provided with a member formed from a photosensitive material, arranging the chip on a common substrate as a chip array in which the chip is arranged in such a manner that the portion for ejection and the side portion are alternately arranged, and separating each chip from the common substrate to obtain the liquid ejection head, the process comprising: an exposure step of relatively moving a reticle of an aligner along the chip with respect to a photosensitive material provided on the common substrate array to expose each chip, and a development step of developing the photosensitive material subjected to the exposure treatment to obtain the member formed from the photosensitive material, wherein a first reticle for forming at least the portion for ejection and a second reticle for forming only the side portion are used as the reticle, and wherein the exposure step comprises a first exposure treatment by the first reticle for at least the portion for ejection and a second exposure treatment by the second reticle for the side portion.

In another aspect of the present invention, there is provided a process for producing a liquid ejection head by providing, in one chip, a liquid ejection head having an ejection orifice forming member in which an ejection orifice array is arranged and an electrode pad member having no ejection orifice array, these members being formed from a photosensitive material, arranging the chip on a common substrate as a chip array in which the chip is arranged in such a manner that the ejection orifice forming member and the electrode pad member are alternately arranged, and separating each chip from the common substrate to obtain the liquid ejection head, the process comprising: (1) an exposure step of relatively moving a reticle for forming an adhesion layer of an aligner along the chip array with respect to a first photosensitive material provided on the common substrate to expose each chip, and an adhesion layer forming step of developing the first photosensitive material subjected to the exposure treatment to form an adhesion layer of the ejection orifice forming member and the electrode pad member to the common substrate, and (2) an exposure step of relatively moving a reticle for the ejection orifice forming member and the electrode pad member of the aligner along the chip array with respect to a second photosensitive material provided on the common substrate on which the adhesion layer has been formed to expose each chip of the chip array, and a member forming step of developing the second photosensitive material subjected to the exposure treatment to form the ejection orifice forming member and the electrode pad member, wherein a first adhesion layer formation reticle for forming at least the adhesion layer of the ejection orifice forming member and a second adhesion layer formation reticle for forming only the adhesion layer of the electrode pad member are used as the reticle for forming the adhesion layer, wherein a first member formation reticle for forming at least the ejection orifice forming member and a second member formation reticle for forming only the electrode pad member are used as the member formation reticle, wherein the exposure step for forming the adhesion layer comprises a first exposure treatment by the first adhesion layer formation reticle for forming at least the adhesion layer of the ejection orifice forming member and a second exposure treatment by the second adhesion layer formation reticle for forming only the adhesion layer of the electrode pad member, and wherein the exposure step for forming the member comprises a first exposure treatment by the first member formation reticle for forming at least the ejection orifice forming member and a second exposure treatment by the second member formation reticle for forming only the electrode pad member.

Further features of the present invention will become apparent from the following description of exemplary embodiments with reference to the attached drawings.

BRIEF DESCRIPTION OF THE DRAWINGS

FIGS. 1A and 1B typically illustrate the state of exposure upon production of a chip which does not fall within a field angle of a stepper in an ejection orifice array direction in the present invention.

FIG. 2 typically illustrates a reticle used in the present invention.

DESCRIPTION OF THE EMBODIMENTS

Figure 3A:
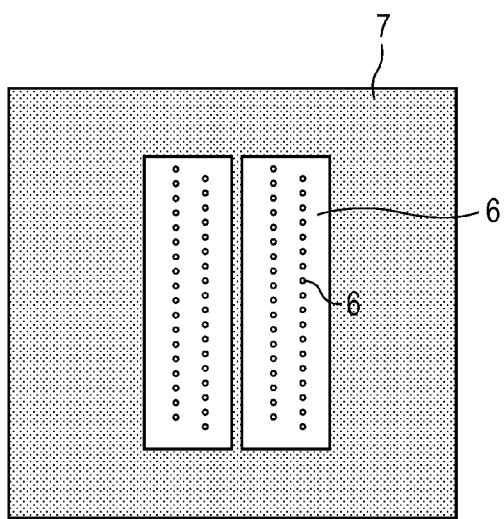
FIG. 3A illustrates a reticle for forming a portion for ejection having an ejection orifice array with a photosensitive material.

Preferred embodiments of the present invention will now be described in detail in accordance with the accompanying drawings.

In the production process according to the present invention, one liquid ejection head is fabricated as a chip in a chip segmentation section of a common substrate, and respective chips are cut out of the common substrate and divided into individual chips after completion of the formation of an intended structure in the respective chips. It is enough that a liquid ejection head fabricated in each chip has a structure according to intended use. As examples of a long length liquid ejection head having a long ejection orifice array, those having such a structure that plural ejection orifice arrays extending to a long side direction of a rectangular chip are arranged in parallel may be mentioned.

An ejection orifice forming member having an ejection orifice array or having an ejection orifice array and a flow path is fabricated on the common substrate through an adhesion layer as needed, whereby a portion for ejection for conducting ejection of a liquid can be provided. This portion for ejection and a side portion having no ejection orifice array, that is, a side portion which does not have a structure for conducting ejection of a liquid, such as an electrode pad member located outside a region in which the ejection orifice array is arranged, are provided in one chip. As examples of this side portion, a portion coming into no physical contact with an ink droplet ejected, such as an electrode pad, a driver circuit on an Si substrate, an electric wiring and a diode sensor element. may be mentioned At least one of the ejection orifice forming member provided in the portion for ejection and the adhesion layer thereof as well as the member provided in the side portion and an adhesion layer thereof can be formed by a photolithographic process using a photosensitive material. A photosensitive material for forming the intended member in each chip section provided on the common substrate is provided, and exposure and development using the photolithography are conducted, whereby a member of the intended form and structure can be formed in each chip. This step by exposure and development is conducting by relatively moving a reticle along a chip array composed of a lots of chips provided on the common substrate, whereby an exposure treatment can be conducted with good efficiency.

The chip array on the common substrate is formed by arranging the chips in such a manner that the portion for ejection and the side portion provided in each chip are alternately arranged. When a long length liquid ejection head having a long ejection orifice array is fabricated in one rectangular chip, the chip array is formed as a chip array in which the respective chips are arranged in parallel in a parallel direction (a lateral direction) of the ejection orifice array or a chip array in which the respective chips are arranged in series in a long side direction (a vertical direction; an extending direction of the ejection orifice array).

An exposure treatment is successively conducted at a predetermined position while relatively moving a reticle of an aligner which has a field angle corresponding to a region to be subjected to the exposure treatment to the common substrate along the chip array. The relative movement of the reticle to the common substrate can be conducted by moving at least one of the reticle and the common substrate.

With respect to the relation between the moving direction of the reticle and the exposure treatment, when a direction from one of the chip array to the other is regarded as a first path and the reverse direction is regarded as a second path, whether the exposure to each chip is conducted in the first path, or the exposure to each chip is conducted in the second path is not limited. Whether the exposure is conducted in the first path or in the second path can be selected according to conditions for an exposure operation. The same applies to an exposure operation in each chip array when plural chip arrays are present.

As an aligner used in the present invention, a stepper-type aligner using a reticle in which a pattern for exposure is provided in a field angle is favorably used. The production process according to the present invention is particularly favorable when a general-purpose aligner utilizing such a reticle that reduction exposure is conducted with a photomask formed with 2 to 5 times magnification in terms of straight line size is used. According to such a reticle, a reticle field angle may not be matched with the whole of one chip or all of plural chips in some cases in the case of the liquid ejection head having the long length ejection orifice array as described above. In such a case, the whole of one chip or all of the plural chips cannot be exposed at one time (batch exposure), and so a chip which needs to be subjected to division exposure is caused. When a boundary between respective exposure patterns upon this division exposure is present near to an ejection orifice, ejection orifice arranging accuracy may be lowered in some cases when alignment between these exposure patterns is not appropriate.

In the present invention, a first reticle for exposing at least a portion for ejection and a second reticle for exposing only a side portion are provided as the reticle.

As the first reticle, that having the following structure may be used.

(I) A reticle having an exposure pattern for exposing only the portion for ejection.

(II) A reticle having an exposure pattern for exposing both the portion for ejection and the side portion at a time.

In addition, as the reticle (II), a reticle capable of exposing both the portions for ejection of two chips adjoining each other in a chip array and a side portion located between these portions for ejection at a time may be used.

The reticle (I) may be used when a reticle field angle in a long side direction of a long length chip or a direction perpendicular to the long side direction is insufficient in length for exposure of the whole of one chip. The reticle (II) may be used when a reticle field angle in the long side direction of a long length chip or the direction perpendicular to the long side direction is insufficient in length for exposure of all of plural chips.

The exposure step in the production process according to the present invention has a first exposure treatment by the first reticle and a second exposure treatment by the second reticle. At least the portion for ejection in each chip is exposed by the first exposure treatment, and only the side portion is exposed by the second exposure treatment.

When a member provided in the portion for ejection is an ejection orifice forming member with an adhesion layer thereof, a member provided in the side portion is an electrode pad member with an adhesion layer thereof, and these members are formed from a photosensitive material, the following respective reticles may be used.

(i) An adhesion layer formation reticle: a first adhesion layer formation reticle for forming at least the adhesion layer of the ejection orifice forming member; and a second adhesion layer formation reticle for forming only the adhesion layer of the electrode pad member.

(ii) A reticle for forming the ejection orifice forming member and the electrode pad member: a first member formation reticle for forming at least the ejection orifice forming member; and a second member formation reticle for forming only the electrode pad member.

An exposure step for forming the adhesion layer using the reticle (i) has a first exposure treatment by the first adhesion layer formation reticle and a second exposure treatment using the second adhesion layer formation reticle.

An exposure step for forming the ejection orifice forming member and the electrode pad member using the reticle (ii) has a first exposure treatment by the first member formation reticle and a second exposure treatment using the second member formation reticle.

As the photosensitive material, a material capable of obtaining a formed portion of an intended form and structure by patterning by a photolithographic process is selected. For example, a negative photosensitive material may be used for the ejection orifice forming member and the electrode pad member. More specifically, an epoxy resin may be mentioned. On the other hand, a positive photosensitive material may be used for the adhesion layers of these members. More specifically, a polyether amide resin may be mentioned.

The exposure region on the common substrate by the first reticle and the exposure region on the common substrate by the second reticle may have an overlapping region partially overlapped each other. This overlapping region is favorably provided in a region outside the portion for ejection, for example, a region outside a region for forming the ejection orifice forming member or the adhesion layer thereof. By providing the overlapping region in this manner, influence of the divisional exposure on the structural accuracy of the ejection orifice forming member as well as on the structural accuracy and arrangement accuracy of an ejection orifice and a flow path can be eliminated. The distance between this overlapping region and an ejection orifice closest to the overlapping region is favorably at least 40 µm. The overlapping region favorably has at least an overlapping greater than the alignment accuracy of an aligner.

The step of fabricating the liquid ejection head in each chip may be selected according to a production process suitable for a structure thereof. When respective chipped liquid ejection heads are arranged as a chip array to conduct the respective steps for production of the liquid ejection head on the common substrate, the above-described exposure treatment may be conducted upon patterning of the adhesion layer and/or the ejection orifice forming member.

The liquid ejection head may be any head so far as the head has such a structure that a chip array capable of being divided from the common substrate can be formed, and exposure and development treatments for patterning of the intended formed portion can be conducted to each chip, and thus the production process according to the present invention can be applied to liquid ejection heads of various structures.

The above-described exposure treatment by the reticle can be applied to a coating resin layer for forming a flow path forming member obtained at a time in each chip on the common substrate. As examples of a process for forming the flow path forming member on the substrate to which this exposure treatment is conducted, various publicly known processes, for example, the following processes may be mentioned.

(A) A process using a solid layer which will become a form of the flow path forming member. As an example of the process using the solid layer which will become a form of the flow path forming member, Process (I) having the following steps (1) to (6) may be mentioned. Process (I):
(1) A step of providing an ejection-energy-generating element on a substrate.
(2) A step of covering the ejection-energy-generating element on the substrate to form a solid layer as a form occupying a portion which will become a flow path.
(3) A step of forming a coating resin layer formed of a photosensitive material for forming the flow path forming member covering the solid layer.
(4) A step of subjecting the coating resin layer to an exposure treatment and a development treatment to form an ejection orifice array.
(5) A step of providing a piercing aperture which will become a supply port for supplying a liquid to the flow path from a back side of the substrate.
(6) A step of removing the solid layer on the substrate using the piercing aperture to form the flow path. Incidentally, the order of the steps (4) to (6) may be changed.

The photosensitive material for forming the coating resin layer may be selected according to the structure of a liquid ejection head, which is an object of production, and a production process thereof. As an example, a positive photosensitive resin such as poly (methyl isopropenyl ketone) is used as a material for forming the solid layer, and exposure and development are conducted according to information, whereby a solid layer of a desired form can be arranged on the substrate. In addition, a negative photosensitive resin composition may be used as a material for forming the coating resin layer. For example, an epoxy resin, a photo-induced cationic polymerization initiator, a sensitizer and methyl isobutyl ketone may be contained in the negative photosensitive resin layer.

(B) A process of forming an orifice plate utilizing an embedding layer (sacrifice layer) after formation of a flow path wall. As an example of the process of forming the orifice plate utilizing the embedding layer (sacrifice layer) after formation of the flow path wall, Process (II) having the following steps (1) to (7) may be mentioned. Process (II):
(1) A step of providing an ejection-energy-generating element on a substrate.
(2) A step of providing a flow path wall on the substrate on which the ejection-energy-generating element has been provided.
(3) A step of embedding an embedding material (sacrifice layer) in a portion which is surrounded by the flow path wall and will become a flow path.
(4) A step of forming a layer for an orifice plate with a photosensitive material on a surface formed by the flow path wall and the embedding material (sacrifice layer).
(5) A step of subjecting the layer for the orifice plate to an exposure treatment and a development treatment to form an ejection orifice array.
(6) A step of providing a piercing aperture which will become a supply port for supplying a liquid to the flow path from a back side of the substrate.
(7) A step of removing the embedding material (sacrifice layer) on the substrate using the piercing aperture to form the flow path.
In the above-described process, a flow path forming member is formed by the flow path wall and the orifice plate (ejection orifice plate).

These processes are disclosed in, for example, Japanese Patent Application Laid-Open No. 2005-205916. According to the process described in this publication, after the flow path wall is covered with the embedding material (sacrifice layer) to conduct an embedding step, an upper surface thereof is then flattened to expose an upper surface of the flaw path wall, and the orifice plate (plate for forming an ejection orifice) is then formed. As described above, various steps may be added as needed.

On the other hand, the adhesion layer to which the exposure treatment according to the present invention can be applied is provided for more improving the adhesion of the flow path forming member or the flow path wall to the substrate. This adhesion layer can be provided by adding a step to the above-described process (A) so as to form the adhesion layer between the flow path forming member or the flow path wall and the substrate.

For example, the steps of coating the substrate with a photosensitive material for forming the adhesion layer, conducting the exposure treatment according to the present invention, and then conducting a development treatment to leave the adhesion layer at a portion which will become an adhesion surface to the flow path forming member are added to between the steps (1) and (2) in the above-described Process I or II, whereby the adhesion layer can be formed. For example, a polyether amide resin may be used as the material for forming the adhesion layer. The process having the adhesion layer forming step is disclosed in, for example, Japanese Patent Application Laid-Open No. 2005-8652.

Figure 10A:
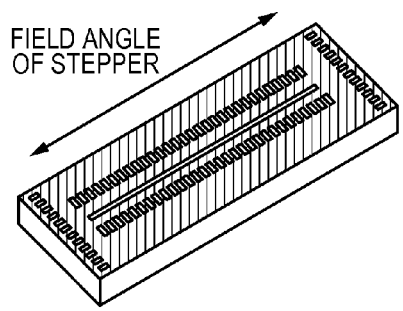
FIGS. 10A, 10B, 10C, 10D and 10E simply illustrate a state of formation of an ejection orifice in the present invention.
Figure 10B:
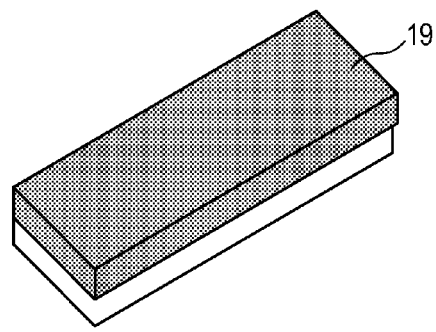
Figure 10D:
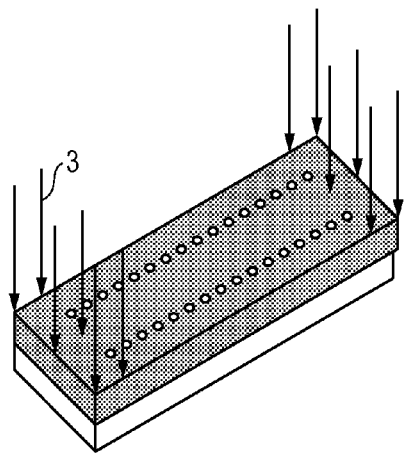
Figure 10C:
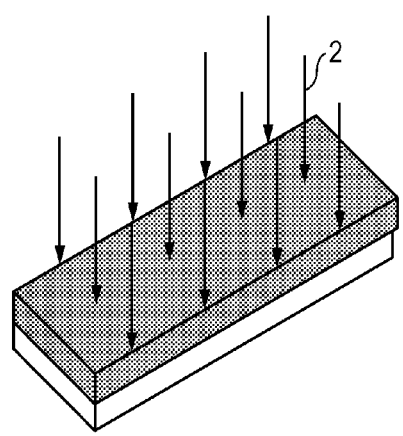
Figure 10E:
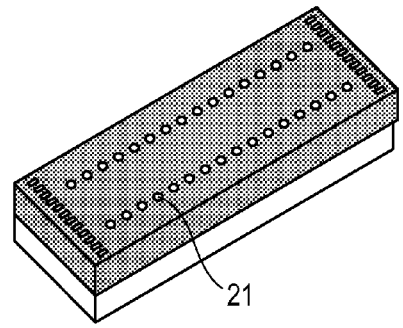

Embodiments of the present invention will hereinafter be described with reference to the attached drawings. FIG. 10E typically illustrates a chip portion extracted from a liquid ejection head fabricated by the production process according to the present invention. The production process according to the present invention can be suitably applied to a liquid ejection head of such a structure.

FIGS. 1A and 1B typically illustrate a state where an ejection orifice array (nozzle array) is formed in each chip on an Si substrate 1 as a common substrate by exposure, which illustrates the state of exposure upon production of a chip which does not fall within a field angle in an ejection orifice array direction. A region surrounded by the heavy line indicates an exposure region of one exposure 2 to an ejection orifice arranging portion (ejection region) which is a portion for ejection to contribute to ejection (batch exposure region). A region surrounded by the dotted line indicates an exposure region of exposure 3 to a side portion which does not directly contribute to ejection and has no relation to ejection. That is to say, a member formed by the exposure to this side portion is formed by an exposure different from the exposure to the portion for ejection which has relation to ejection.

The situation that one chip on the common substrate does not fall within a reticle field angle is then described. This means that the portion for ejection in which an ejection orifice having relation to ejection is arranged falls within the field angle by one-time exposure 2 but the whole of the chip does not fall within the angle field by one exposure in a nozzle array direction or a direction perpendicular to the nozzle array direction.

FIG. 2 typically illustrates a model (before formation of an exposure pattern) of a reticle 5 used in exposure upon production. A light shielding portion is covered with chrome plating, and a portion capable of forming a pattern is illustrated by the blank. A desired exposure pattern is formed in this reticle 5 to control transmission of light. The photosensitive material arranged in each chip includes a positive type and a negative type which are such a type that a portion exposed to light is left and such a type that a portion exposed to light is lost by decomposition and the like, respectively. In fact, there is also a material to which a temperature is applied or a material immersed in a developer. In addition, in the production process according to the present invention, both the positive photosensitive material and the negative photosensitive material are properly used according to a portion forming a liquid ejection head, and so the production process is used in either case.

Figure 7A:
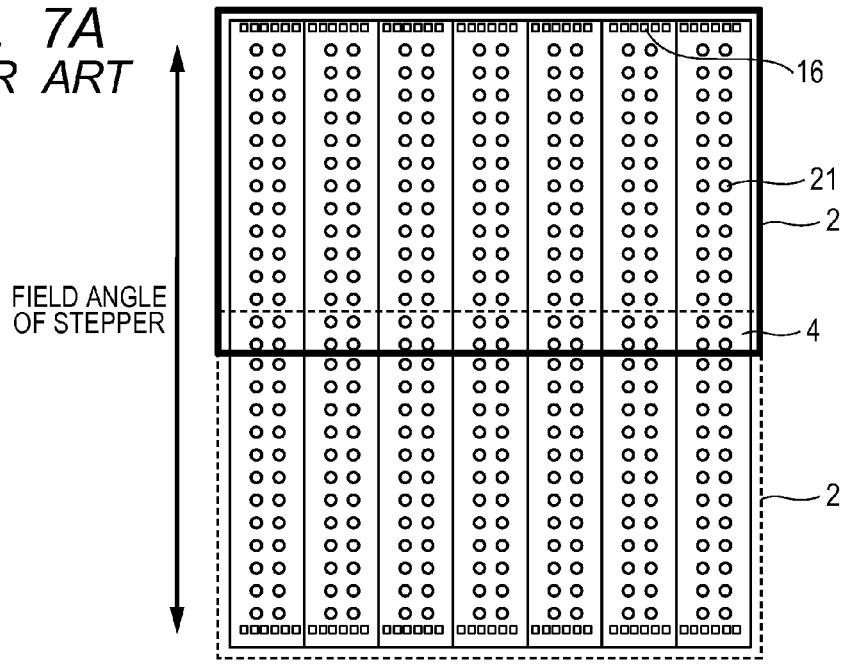
FIG. 7A typically illustrates a state of exposure in a conventional example, and FIG. 7B typically illustrates the state of exposure in another conventional example.
Figure 7B:
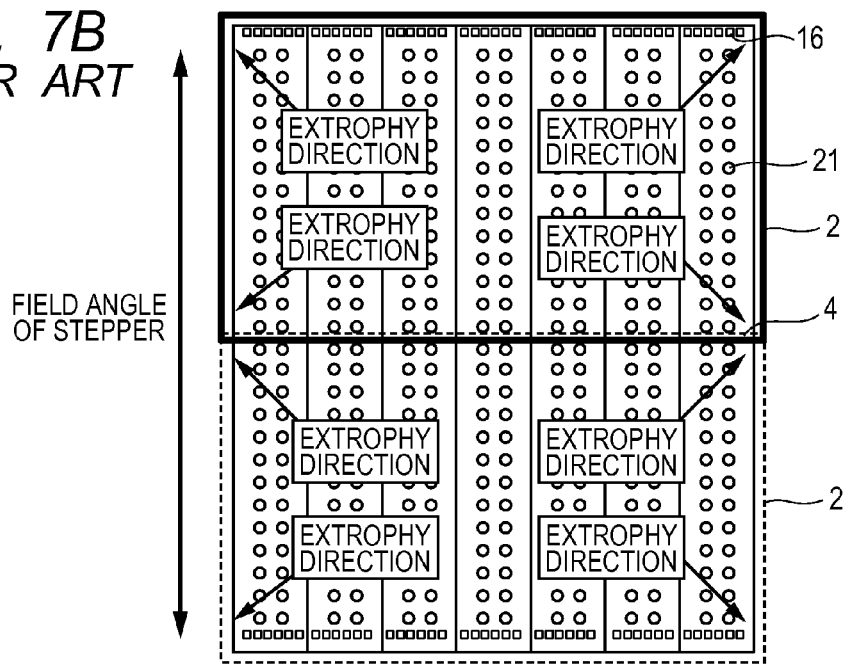
Figure 8A:
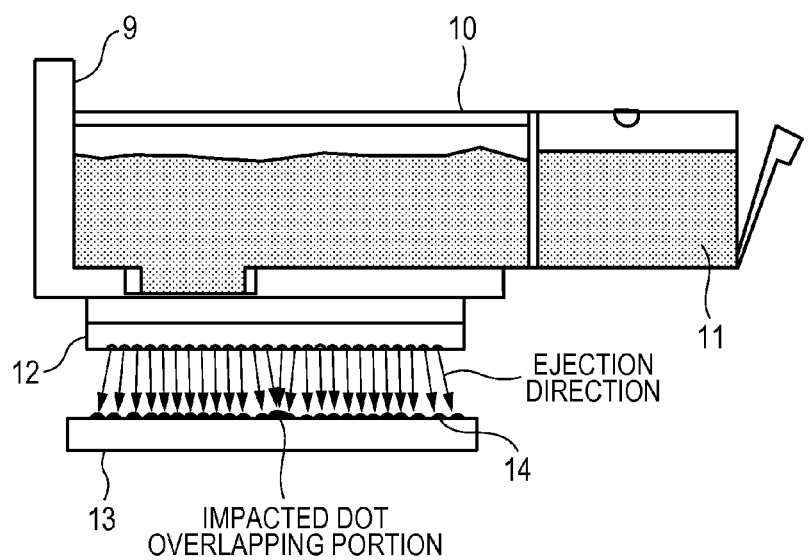
FIG. 8A illustrates a state of printing by a liquid ejection head prepared in FIG. 7B.
Figure 8B:
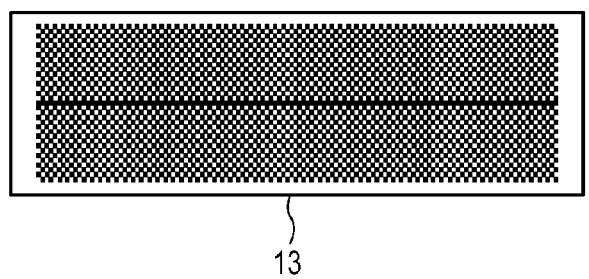
FIG. 8B illustrates a recording medium on which the printing in FIG. 8A is conducted.
Figure 9A:
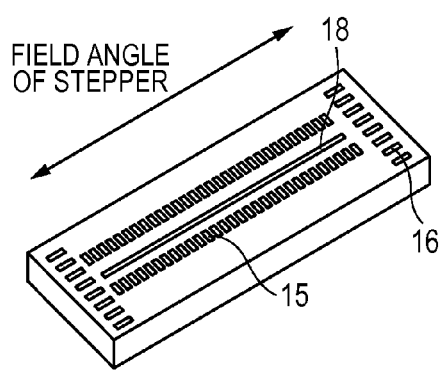
FIGS. 9A, 9B, 9C and 9D simply illustrate a state of formation of an adhesion layer in the present invention.
Figure 9B:
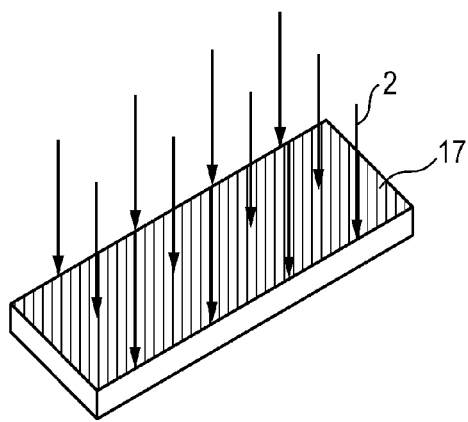
Figure 9C:
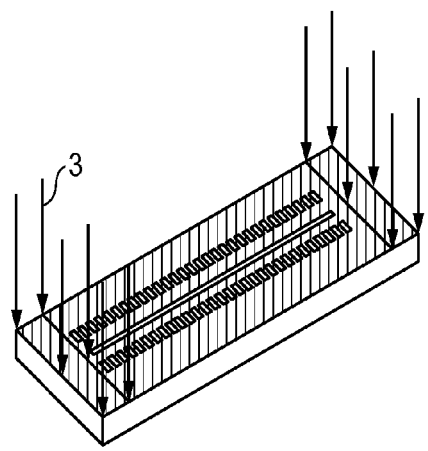
Figure 9D:
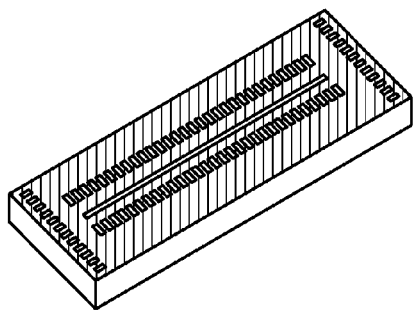

In FIG. 1B, two chips fall within the field angle in a direction perpendicular to the nozzle array direction. Regarding the nozzle array direction, however, a side portion which does not directly contribute to ejection, such as an electrode pad portion, does not fall within the field angle for one exposure. In such a case, a process in which exposure is conducted twice with the field angle divided into the upper and lower portions in the middle of the ejection orifice array as illustrated in FIG. 7A or 7B to complete the exposure has heretofore been mainly employed. However, when the exposure is dividedly conducted twice or more as illustrated in FIG. 7A or 7B, a double exposure overlapping region 4 has to be provided taking alignment of the apparatus and the like into account. However, when such a structure as illustrated in FIG. 7A is adopted, in recent years in which high density and high image quality have been intended, an overexposed portion such as the above-described double exposed portion affects nozzle formation, so that a level difference may be formed at an inner surface of an ejection orifice in some cases to affect printing. In addition, the size of an ejection orifice in the double exposed portion with a large amount of exposure becomes small, and so there is an anxiety that a white stripe appears in a printed article because an ejection amount of a liquid from the ejection orifice becomes small. When the exposure is dividedly conducted so as not to cause overexposure in the ejection orifice forming region as illustrated in FIG. 7B, influence of generation of distortion regarding telecentricity may be exerted in some cases. That is to say, the ejection direction of an ejection orifice formed nearly to a boundary between the first exposure and the second exposure in a central portion of a long side direction of the chip may be directed to sides thereof in some cases. As a result, a black stripe may appear in a central portion of a printed article in some cases as illustrated in FIG. 8B. FIG. 8A typically illustrate the state of printing with a head produced by the method illustrated in FIG. 7B. In addition, when the method illustrated in FIG. 7A or 7B is used, designing may not be possible when alignment tolerance of the apparatus upon production is taken into account in the case where an ejection orifice arrangement density is high. Thus, in the present invention, a portion including an ejection orifice which directly contributes to ejection conditions is completed by one exposure when one or plural chips are fabricated by multi-exposure. By doing so, ejection stability and high reliability can be ensured without causing the above-described problems. In addition, a portion close to an end of the reticle field angle is used as a connecting portion to the next exposure as illustrated in FIG. 1B, whereby even if the telecentric influence appears, the problem thereof can be corrected by structural designing or proper handling, unlike the case of the central portion of the long side direction of the chip.

Figure 3B:
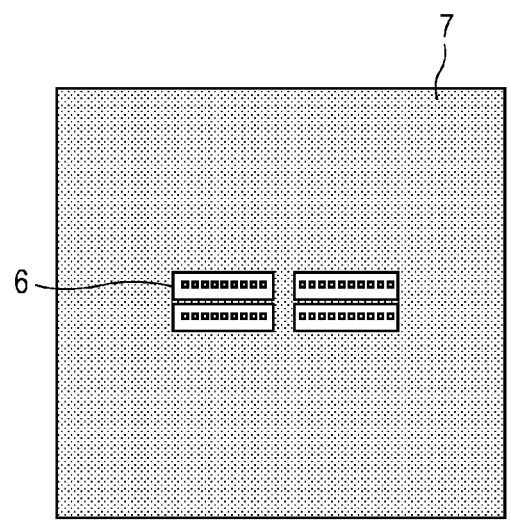
FIG. 3B illustrates a reticle for forming an electrode pad member, ejection, with a photosensitive material.

In the case where the exposure is conducted as illustrated in FIG. 1B, when an ejection orifice forming member having an ejection orifice, a flow path and so on is formed with a photosensitive material such as an epoxy resin having photosensitivity, a rectangular reticle 7 illustrated in FIG. 3A is used. Since the above-described resin is cured and left by exposure, another portion than a portion where the ejection orifice is intended to be formed is covered with chromium for shielding in FIG. 3A. In FIG. 3A, the reticle 7 for exposing only an ejection orifice portion relating to ejection is illustrated. In FIG. 3B, a reticle 8 for exposing a portion around an electrode pad not directly but indirectly relating to ejection of liquid droplets, such as an electrode pad portion, is illustrated. The portion around the electrode pad is such that every pad is cut out. However, all pads may be cut out at a time. In addition, for better efficiency, in a chip located at the top in the Si substrate 1 as illustrated in FIG. 1A, a portion exposed by using the reticle illustrated in FIG. 3B is prepared for one chip, and a portion around a lower electrode pad of the chip is exposed together with a portion around an upper electrode pad of a chip just under that chip. This is also applied to a chip located at the bottom in the Si substrate 1. The reticle illustrated in FIG. 3A and the reticle illustrated in FIG. 3B are designed in such manner that regions to be exposed partially overlap each other in a portion not relating to ejection, taking account of alignment tolerance of the apparatus as illustrated in FIG. 1B. A level difference occurs at this overlapping double exposed portion. However, this portion has no relation to ejection, and so no influence is exerted on printing, and reliability is not impaired. A process for forming the ejection orifice forming member in this manner is illustrated in FIGS. 10A to 10E. FIGS. 10A to 10E typically illustrate a process of exposure until completion for one chip under production. In this embodiment, after coating of a photosensitive material 19 on a substrate provided with an adhesion layer in one chip, exposure 2 for forming the ejection orifice forming member, and exposure 3 for forming the electrode pad member, development is conducted to form a member having an ejection orifice 21 and a hole for the electrode pad.

Incidentally, in the embodiment illustrated in FIGS. 10A to 10E, the ejection orifice forming member present in the portion for ejection and the electrode pad member present in the side portion are formed by exposure and development treatments to a coating layer formed of the same photosensitive material, and these members are continuously formed. The structure of the liquid ejection head is not limited to this embodiment, and thus the ejection orifice forming member present in the portion for ejection and the side portion may be independently formed.

Figure 4A:
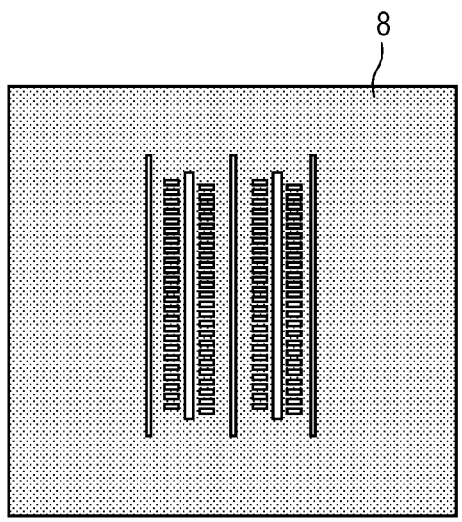
FIG. 4A illustrates a reticle for forming an adhesion layer of an ejection orifice forming member.
Figure 4B:
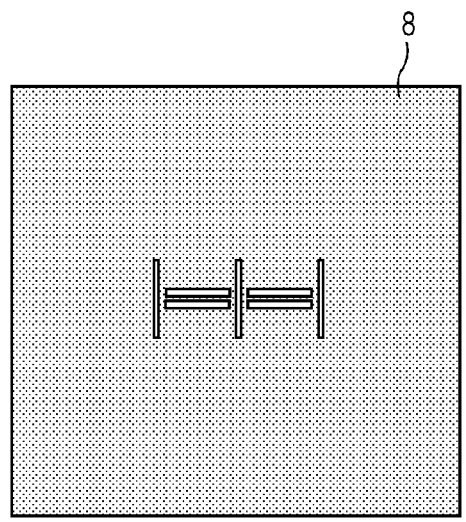
FIG. 4B illustrates a reticle for forming an adhesion layer of an electrode pad member, which is irrelevant to ejection.

In the case where the exposure is conducted as illustrated in FIG. 1B, when the adhesion layer of the ejection orifice forming member is formed with a resin which improves adhesion, such as polyether amide having photosensitivity, reticles illustrated in FIGS. 4A and 4B are used. First, a patterning layer formed of the photosensitive polyether amide is formed. For example, a coating liquid obtained by dissolving a composition containing the photosensitive polyether amide in a proper solvent is applied on to an Si substrate by, for example, a spin coating method to form the patterning layer which will become the adhesion layer by exposure and development at a position where the Si substrate is joined to a liquid flow path forming member. Thereafter, baking may also be conducted as needed. The film thickness of the patterning layer is favorably controlled to 1 to 3 µm. Since this resin is such a type that a portion exposed to light is decomposed without being cured and removed by development, the reticle 8 is so designed that light is applied to a surface of a heater as an ejection-energy-generating element, a portion where a ink supply port is formed, or an upper portion of the electrode pad.

In FIG. 4A, the reticle 8 for exposing only an ejection orifice portion having relation to ejection is illustrated. In FIG. 4B, the reticle 8 for exposing a portion around an electrode pad having not direct but indirect relation to ejection of liquid droplets, such as the electrode pad, is illustrated. The reticle illustrated in FIG. 4A and the reticle illustrated in FIG. 4B are designed in such manner that regions to be exposed partially overlap each other in a portion having no relation to ejection, taking account of alignment tolerance of the apparatus as illustrated in FIG. 1B. A process for forming the adhesion layer in this manner is illustrated in FIGS. 9A to 9E. FIGS. 9A to 9E typically illustrate a process of exposure until completion for one chip under production. In this embodiment, after coating of a photosensitive material 17 on a substrate provided with an ink supply port 18, an electrode pad 16 and a heater 15 in one chip, exposure 2 for forming the adhesion layer of the ejection orifice forming member, and exposure 3 for forming the electrode pad member, development is conducted to form the adhesion layers of these members.

EXAMPLES

Example 1

In a first embodiment of the present invention, an i-line stepper FPA 350015 in which a 1:5 reduction projection lens is installed in a reticle having a field angle of 22 mm×22 mm is used. In each chip, an epoxy resin or a polyether amide resin which has photosensitivity and has been applied on to an Si substrate is subjected to exposure treatments according to purposes by using the reticle and the stepper as an aligner.

The size in a long side direction of each chip is about 26 mm, and the width of a portion in which an ejection orifice relating to ejection is provided is about 21.7 mm. The size in a short side direction of the chip is about 2.1 mm. When the field angle in the long side direction of the chip is fully used, the field angle in the short side direction becomes narrow. The reason for it is that the reticle 5 is octagonal, not square, as illustrated in FIG. 2. Taking a width for cutting (separating) chips into consideration, the number of chips falling within the field angle of the reticle 5 in the short side direction upon one exposure is thereby 8. Regarding the exposure in the short side direction of the chip, however, the number of chips in the short side direction may be less than 8 in some cases by limitation such as an alignment mark added to the Si substrate upon formation of a heater.

The remainder in the long side direction of the chip including an electrode pad 16 in a portion which does not directly contribute to ejection of a liquid is then exposed. At this time, a double exposure overlapping region 4 several microns wide is provided with respect to an end of the exposed portion in which the ejection orifice is provided to conduct the exposure. In other chips than chips located at the top and the bottom of the Si substrate, a lower portion of the pad of an upper chip and an upper portion of the pad of a lower chip are exposed at a time. In addition, upper and lower pads of the chip 16 are exposed to complete eight chips by conducting the exposure three times in total.

Example 2

Figure 5:
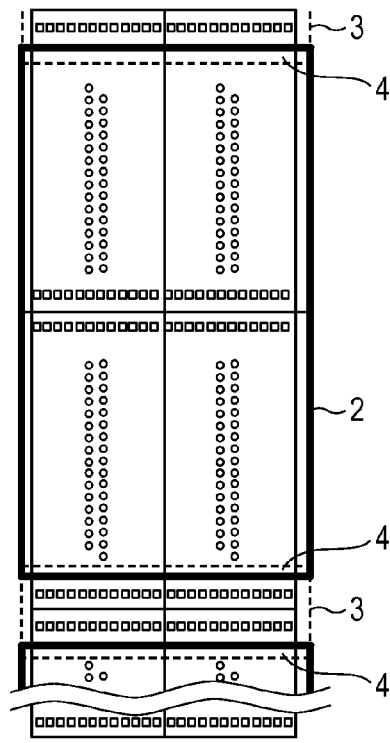
FIG. 5 illustrates an embodiment of the present invention.

When portions of two chips in which an ejection orifice contributing to ejection is provided fall within a field angle for one exposure in the long side direction, an electrode pad portion between upper and lower chips is exposed by exposure 2 at the same time as the portions in which the ejection orifice directly contributing to ejection of a liquid is provided as illustrated in FIG. 5. In Example 1, the chips have been completed by conducting the exposure three times. In this example, however, one chip is completed by conducting the exposure twice. Other than this, the exposure is conducted by, for example, providing the double exposure overlapping region 4 in the same manner as the above.

In this example, two chip arrays are arranged in parallel, and one exposure treatment is conducted for two chips in the long side direction of each chip array, whereby four chips in total come to be treated by one exposure 2.

Incidentally, the two chips in the long side direction of each chip array are exposed by the exposure 2 in FIG. 5. However, the number of chips exposed at a time in the long side direction by the exposure 2 may be 3 or more according to the size of the reticle field angle, and the structure and size of each chip.

Example 3

Figure 6A:
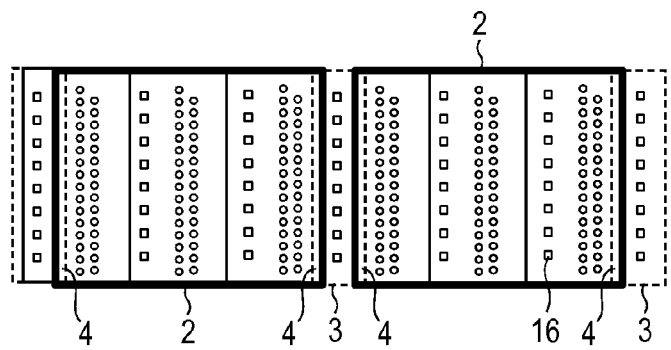
FIG. 6A illustrates another embodiment of the present invention.
Figure 6B:
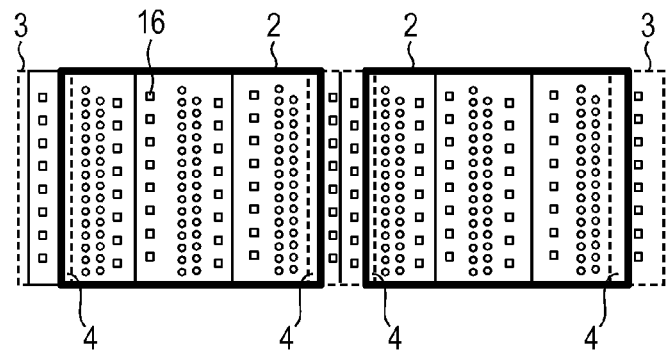
FIG. 6B illustrates a further embodiment of the present invention.

When there is a portion in which an electrode pad is arranged in a short side direction of a chip not contributing to ejection, plural chips in the short side direction are exposed at a time as illustrated in FIG. 6A or 6B, so that a portion around the electrode pad 16 is separately exposed. According to this production process, a chip completed by conducting exposure once and a chip completed by conducting exposure twice are present. Even in this case, the exposure is conducted in the same manner as in Examples 1 and 2 except that the long side direction is changed to the short side direction. The long side direction of the chip falls within a field angle for one exposure. FIG. 6A illustrates a case where pads 16 are integrally arranged on one side in the short side direction of the chip, and FIG. 6B illustrates a case where pads 16 are dispersedly and arranged on both sides in the short side direction of the chip.

In this example, one exposure treatment is conducted by the exposure 2 for three chips in a chip array direction of each chip array. However, the number of chips exposed at a time in the chip array direction of each chip array by the exposure 2 may be 4 or more according to the size of the reticle field angle, and the structure and size of each chip.

According to the present invention, exposure of the portion for ejection which has an ejection orifice array of a liquid ejection head can be completed by one exposure without conducting the exposure plural times. When a double exposure portion is present, the double exposure portion is provided at a side portion other than the portion for ejection. As a result, a liquid ejection head by which stable liquid ejection from an ejection orifice and good impac position accuracy of a liquid on a recording medium are achieved can be produced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-003559, filed Jan. 11, 2013, which is hereby incorporated by reference herein in its entirety.

What is claimed is:

1. A process for producing a liquid ejection head by providing, in one chip, a liquid ejection head having a portion for ejection in which an ejection orifice array is arranged and a side portion having no ejection orifice array, these portions being provided with a member formed from a photosensitive material, arranging the chip on a common substrate as a chip array in which the chip is arranged in such a manner that the portion for ejection and the side portion are alternately arranged, and separating each chip from the common substrate to obtain the liquid ejection head, the process comprising:

an exposure step of relatively moving a reticle of an aligner along the chip array with respect to a photosensitive material provided on the common substrate to expose each chip, and a development step of developing the photosensitive material subjected to the exposure treatment to obtain the member formed from the photosensitive material, wherein a first reticle for forming at least the portion for ejection and a second reticle for forming only the side portion are used as the reticle, and wherein the exposure step comprises a first exposure treatment by the first reticle for at least the portion for ejection and a second exposure treatment by the second reticle for the side portion.

2. The process according to claim 1, wherein the member formed from the photosensitive material in the portion for ejection is an ejection orifice forming member, and the member formed from the photosensitive material in the side portion is an electrode pad member.

3. The process according to claim 2, wherein the photosensitive material is a negative epoxy resin.

4. The process according to claim 1, wherein the member formed from the photosensitive material in the portion for ejection is an adhesion layer provided between an ejection orifice forming member and the common substrate, and the member formed from the photosensitive material in the side portion is an adhesion layer provided between an electrode pad member and the common substrate.

5. The process according to claim 4, wherein the photosensitive material is of a positive type.

6. The process according to claim 1, wherein the first exposure treatment comprises a batch exposure for both portions for ejection of two chips adjoining each other in the chip array and for the side portion located between these portions for ejection.

7. The process according to claim 1, wherein the second exposure treatment comprises exposure for forming only the side portion located between both portions for ejection of two chips adjoining each other in the chip array.

8. The process according to claim 1, wherein an exposed region on the common substrate by the first exposure treatment and an exposed region on the common substrate by the second exposure treatment have an overlapping region partially overlapping each other in a region outside the portion for ejection.

9. The process according to claim 8, wherein a distance between the overlapping region and an ejection orifice closest to the overlapping region is at least 40 µm.

10. The process according to claim 1, wherein an exposure treatment to one chip comprises the first exposure treatment conducted once and the second exposure treatment conducted twice.

11. The process according to claim 1, wherein an exposure treatment to one chip comprises the first exposure treatment conducted once and the second exposure treatment conducted once.

12. A process for producing a liquid ejection head by providing, in one chip, a liquid ejection head having an ejection orifice forming member in which an ejection orifice array is arranged, and an electrode pad member having no ejection orifice array, these members being formed from a photosensitive material, arranging the chip on a common substrate as a chip array in which the chip is arranged in such a manner that the ejection orifice forming member and the electrode pad member are alternately arranged, and separating each chip from the common substrate to obtain the liquid ejection head, the process comprising:

(1) an exposure step of relatively moving a reticle for forming an adhesion layer of an aligner along the chip array with respect to a first photosensitive material provided on the common substrate to expose each chip, and an adhesion layer forming step of developing the first photosensitive material subjected to the exposure treatment to form an adhesion layer of the ejection orifice forming member and the electrode pad member to the common substrate, and (2) an exposure step of relatively moving a reticle for the ejection orifice forming member and the electrode pad member of the aligner along the chip array with respect to a second photosensitive material provided on the common substrate on which the adhesion layers have been formed to expose each chip of the chip array, and a member forming step of developing the second photosensitive material subjected to the exposure treatment to form the ejection orifice forming member and the electrode pad member, wherein a first adhesion layer formation reticle for forming at least the adhesion layer of the ejection orifice forming member and a second adhesion layer formation reticle for forming only the adhesion layer of the electrode pad member are used as the reticle for forming the adhesion layer formation, wherein a first member formation reticle for forming at least the ejection orifice forming member and a second member formation reticle for forming only the electrode pad member are used as the member formation reticle, wherein the exposure step for forming the adhesion layer comprises a first exposure treatment by the first adhesion layer formation reticle for forming at least the adhesion layer of the ejection orifice forming member and a second exposure treatment by the second adhesion layer formation reticle for forming only the adhesion layer of the electrode pad member, and wherein the exposure step for forming the member comprises a first exposure treatment by the first member formation reticle for forming at least the ejection orifice forming member and a second exposure treatment by the second member formation reticle for forming only the electrode pad member.

13. The process according to claim 12, wherein the first photosensitive material is of a positive type, and the second photosensitive material is of a negative type.

14. The process according to claim 12, wherein the first exposure treatment for forming the adhesion layer comprises a batch exposure for forming adhesion layers of both ejection orifice forming members of two chips adjoining each other in the chip array and an adhesion layer of an electrode pad member located between these adhesion layers.

15. The process according to claim 12, wherein the second exposure treatment for forming the adhesion layer comprises an exposure for forming only an adhesion layer of an electrode pad member located between adhesion layers of both ejection orifice forming members of the two chips adjoining each other in the chip array.

16. The process according to claim 12, wherein the first exposure treatment for forming the member comprises a batch exposure for forming both ejection orifice forming members of two chips adjoining each other in the chip array and an electrode pad member located between these ejection orifice forming members.

17. The process according to claim 12, wherein the second exposure treatment for forming the member comprises an exposure for forming only an electrode pad member located between both ejection orifice forming members of two chips adjoining each other in the chip array.

18. The process according to claim 12, wherein in at least one of the exposure step for forming the adhesion layer and the exposure step for forming the member, an exposed region on the common substrate by the first exposure treatment and an exposed region on the common substrate by the second exposure treatment have an overlapping region partially overlapping each other in a region outside the portion for ejection.

19. The process according to claim 18, wherein a distance between the overlapping region and an ejection orifice closest to the region is at least 40 μm.

20. The process according to claim 18, wherein the overlapping region has at least an overlapping greater than an alignment accuracy of the aligner.

* * * * *